US007530822B2

(12) United States Patent
Liao

(10) Patent No.: US 7,530,822 B2
(45) Date of Patent: May 12, 2009

(54) ELECTRICAL CONNECTOR ASSEMBLY WITH IMPROVED PICK-UP CAP

(75) Inventor: Fang-Jun Liao, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/012,921

(22) Filed: Feb. 5, 2008

(65) Prior Publication Data

US 2008/0188103 A1 Aug. 7, 2008

(30) Foreign Application Priority Data

Feb. 5, 2007 (TW) .............................. 96202169 U

(51) Int. Cl.
*H01R 13/44* (2006.01)

(52) U.S. Cl. .......................... 439/135; 439/41; 439/940

(58) Field of Classification Search ................. 439/135, 439/41, 940, 331
See application file for complete search history.

(56) References Cited

U.S. PATENT DOCUMENTS

| | | | | |
|---|---|---|---|---|
| 6,599,140 | B1 * | 7/2003 | Chen et al. | 439/135 |
| 6,905,353 | B2 | 6/2005 | Ma et al. | |

FOREIGN PATENT DOCUMENTS

| | | | |
|---|---|---|---|
| CN | 2609213 | * | 3/2004 |
| CN | 2629252 | * | 7/2004 |

* cited by examiner

*Primary Examiner*—Javaid Nasri
(74) *Attorney, Agent, or Firm*—Wei Te Chung

(57) ABSTRACT

An electrical connector assembly (1) includes an electrical connector including an insulative housing (2) having an upper and a lower surfaces, and a number of contacts received in the insulative housing, an pick-up cap (3) assembled to the insulative housing. Four pairs of latching sections (36) extend from four edges of the body portion (30) of the pick-up cap toward the insulative housing (2), and the insulative housing (2) defines four pairs of recesses (224) to latch with the latching sections (36).

8 Claims, 3 Drawing Sheets

1
3
30
34
36
32
2
20
221
22
2210
223
21
224

ELECTRICAL CONNECTOR ASSEMBLY WITH IMPROVED PICK-UP CAP

BACKGROUND OF THE INVENTION

1. Field of the Invention

The present invention generally relates to an electrical connector assembly, and more particularly to an electrical connector assembly for removably mounting a chip module, such as a Central Processing Unit (CPU), to a printed circuit board.

Conventional electrical connector is described in Chinese Patents Nos. CN2629252 and CN2609213, both disclose an electrical connector assembly for electrically connecting a chip module to a printed circuit board. The electrical connector assembly comprises an insulative housing, a plurality of contacts received in the insulative housing, and a pick up cap assembled on the insulative housing. In general, the pick up cap defines a plurality of hooks at two sides of a body portion for engaging with the insulative housing so as to assemble the pick up cap on the insulative housing. However, a weight of the electrical connector is becoming greater, the pick up often separates from the insulative housing and the insulative housing easily occurs shaking.

2. Description of Related Art

U.S. Pat. No. 6,905,353, issued on Jun. 14, 2005 and assigned to HonHai, discloses an electrical connector assembly for electrically connecting a chip module to a printed circuit board. The electrical connector assembly comprises an insulative housing, a plurality of contacts received in the insulative housing, and a pick-up cap covering the insulative housing. The insulative housing defines a plurality of contact-receiving slots passing through an upper and a lower surfaces thereof. The contacts are received in the contact-receiving slots and each contact has an upper and a lower contacting ends. The insulative housing is displaced on the printed circuit board to form electrical connections between the lower contacting ends of the contacts and the printed circuit board. Then the chip module is placed upon the upper surface of the insulative housing to form electrical connection with the upper contacting ends of the contacts. Thus, an electrical connection between the chip module and the printed circuit board is established.

The pick-up cap is attached to the insulative housing and can be absorbed by a vacuum mechanism to practice a movement of the electrical connector. The pick-up cap covers the upper surface of the insulative housing to prevent dust from outside and protect the upper contacting ends of the contacts. However, the pick-up cap is provided with a plurality of latches only on two opposite sides thereof. So I understood the latches only hold two sides of the insulative housing. Thus if the weight of the insulative housing with the contacts is not symmetrical, the insulative housing may rock and even separates from the pick-up cap when the electrical connector assembly is moved in virtue of the vacuum.

Therefore, it is desired to provide an improved electrical connector assembly to stress the problems mentioned above.

BRIEF SUMMARY OF THE INVENTION

Accordingly, an object of the present invention is to provide an electrical connector assembly, which can reliably protect the contacts.

In order to achieve the above-mentioned object, an electrical connector assembly, comprises an electrical connector and a pick-up cap. The electrical connector comprises an insulative housing having an upper and a lower surfaces; and a plurality of contacts received in the insulative housing. Each contact is formed with an upper and a lower ends exposed beyond the upper and the lower surfaces of the insulative housing, respectively. The pick-up cap is assembled to the insulative housing and comprises a body portion with four side edges. Each side edge provides with a pair of latching sections extending downwardly to latch the insulative housing.

Other objects, advantages and novel features of the invention will become more apparent from the following detailed description of the present embodiment when taken in conjunction with the accompanying drawings.

DETAILED DESCRIPTION OF THE INVENTION

Figure 1:
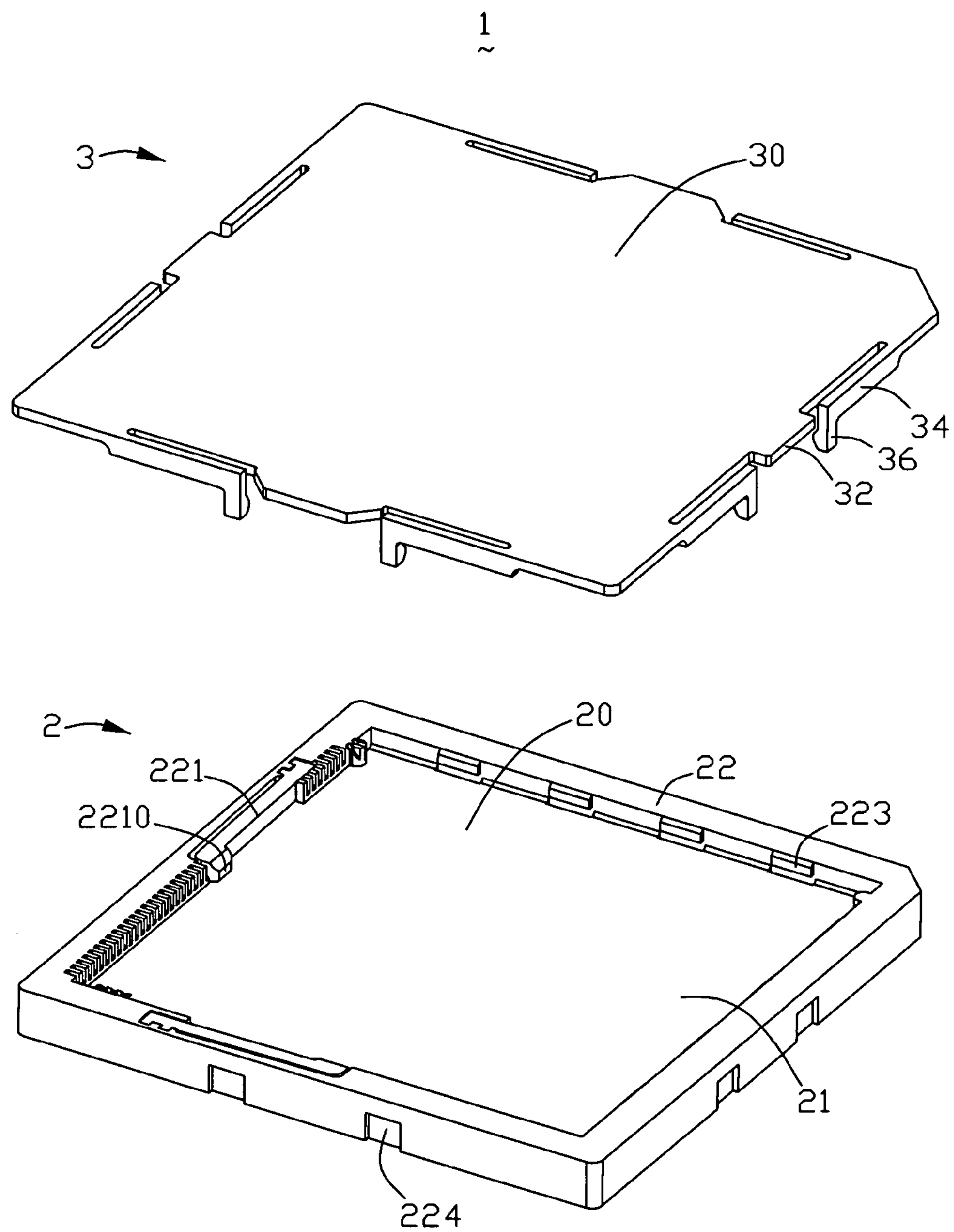
FIG. 1 is an exploded, perspective view of an electrical connector assembly in accordance with a preferred embodiment of the present invention.

Reference will now be made to the drawing figures to describe the present invention in detail.

Figure 2:
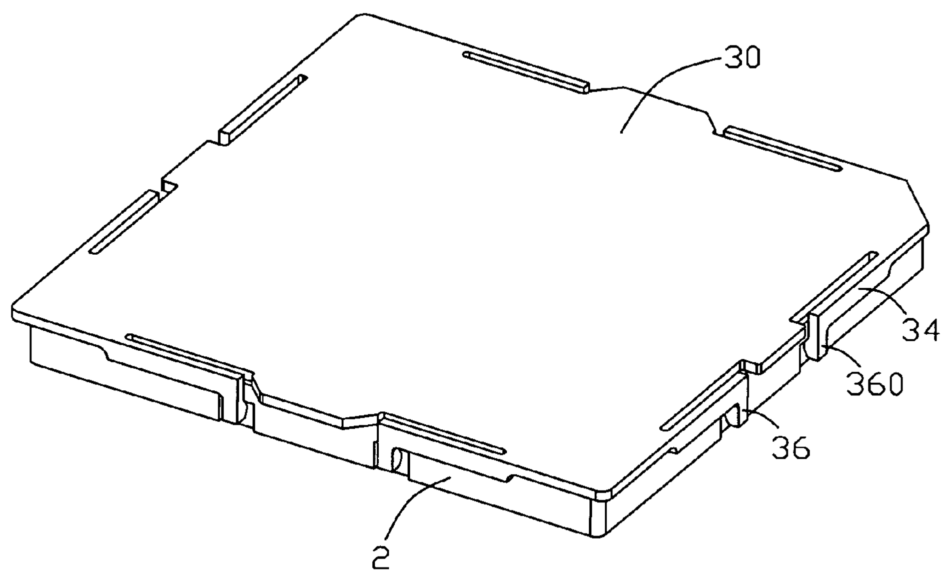
FIG. 2 is an assembled, perspective view of the electrical connector assembly of FIG. 1.
Figure 3:
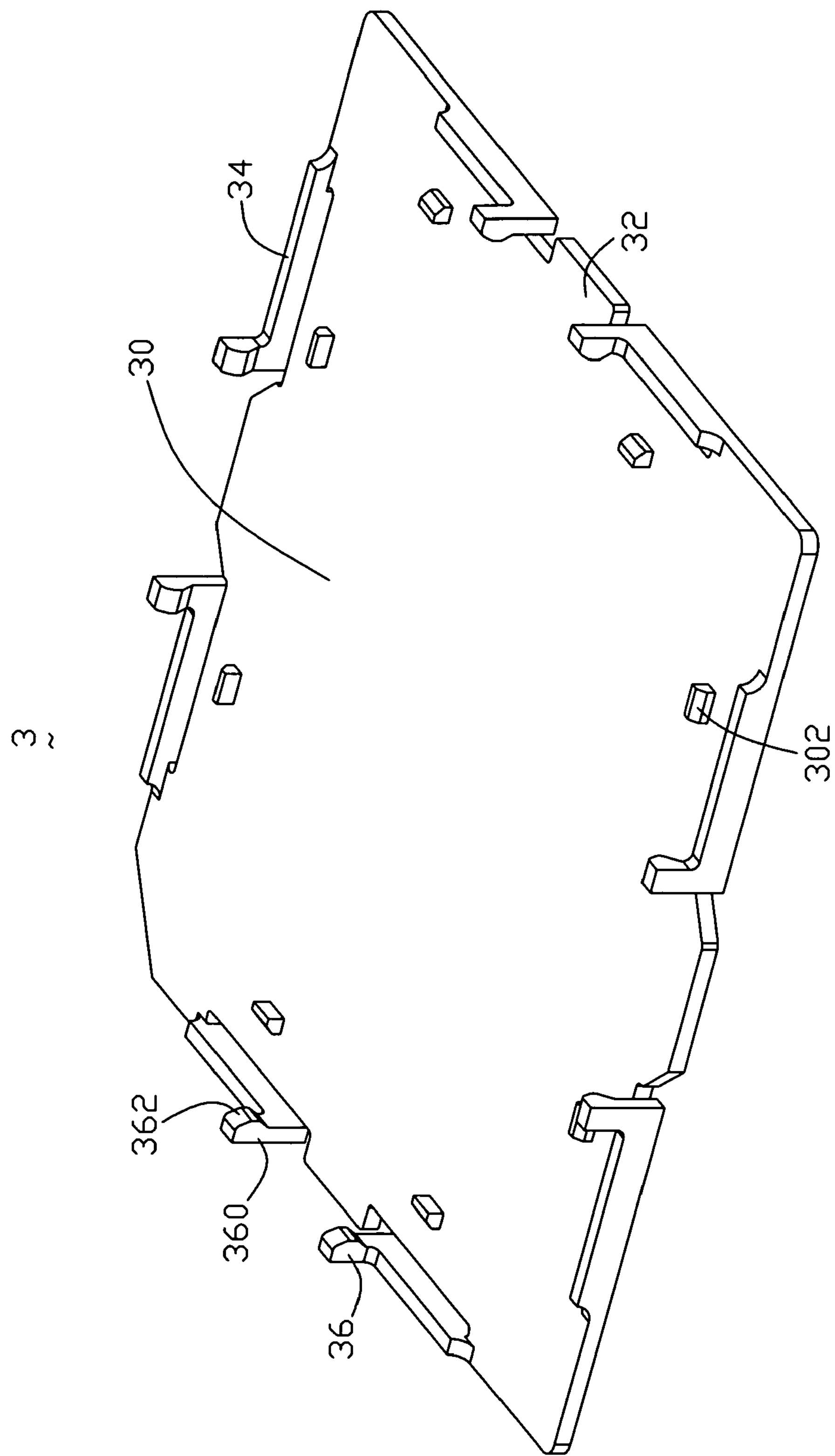
FIG. 3 is a perspective view of a pick-up cap of the electrical connector assembly of FIG. 1.

Please refer to FIGS. 1-3, an electrical connector assembly 1 in accordance with the preferred embodiment of the present invention is used for electrically connecting a chip module (not shown), such as a Central Processing Unit (CPU), with a printed circuit board (PCB, not shown). The electrical connector assembly 1 comprises an insulative housing 2, a plurality of contacts (not shown) accommodated in the insulative housing 2, a pick-up cap 3 covering the insulative housing 2 and the contacts (not shown).

The insulative housing 2 is substantially a rectangular shape, and comprises a main portion 21 and four sidewalls 22 extending upwardly from a peripheral of the main portion 21. The main potion 21 and the sidewalls 22 together define a receiving space 20 for accommodating the chip module (not shown). A plurality of contact-receiving passages (not shown) are defined through an upper and a lower surfaces of the main portion 21 to receive the contacts (not shown) therein. Two adjacent sidewalls 22 each form a spring arms 221 splitting from inner sides thereof and facing the receiving space 20. Each spring arm 221 forms a protrusion 2210 at a free end thereof to protrude into the receiving space 20 for elastically abutting against the chip module (not shown). The other two sidewalls 22 each form some projections 223 aligned in a row to be regarded as a local datum for the chip module (not shown). Each sidewall 22 defines a pair of spaced recesses 224 on an out side surface thereof. The recesses 224 open toward the bottom surface of the insulative housing 2 and also communicate with out side surface of the sidewalls 22.

Each contact (not shown) comprises an upper and a lower contacting ends (not shown) respectively exposed beyond the upper and the lower surfaces of the insulative housing 2.

The pick-up cap 3 is a flat board and comprises a body portion 30 with an approximate rectangle shape covering upper surfaces of the sidewalls 22 of the insulative housing 2 and two pairs of detaching portions 32 protruding from four edges of the body portion 30. A pair of elastic arms 34 split from each edge of the body portion 30 and extend toward each other, the elastic arms 34 are located at opposite sides of corresponding detaching portion 32, respectively. A latching section 36 extends downwardly from an free end of each elastic arms 34, and each latching section 36 comprises a stretching arm 360 connecting with the elastic arm 34 and a latching portion 362 formed at a free end of the stretching arm 360. The latching portions 362 of a pair of latching sections 36 on the same sidewall 22 locate adjacent to the detaching portion 32. A plurality of ribs 302 extend downwardly from a bottom surface of the body portion 30 toward the insulative housing 2 for abutting against the sidewall 22 of the insulative housing 2. The top surface of the body portion 30 of the pick-up cap 3 is smooth and is capable of being absorbed by a vacuum mechanism (not shown) to practice a movement of the insulative housing 2 with the contacts (not shown).

Thus, when the pick-up cap 3 is assembled on the insulative housing 2, the stretching arms 360 of the latching sections 36 are seated on the edges of the sidewalls 22 of the insulative housing 2. Then, the elastic arms 34 shrink outwardly and slightly to move downwardly by a downward exterior force, thereby the latching portions 362 of the latching sections 36 are received in the recesses 224 on the four sidewalls 22 of the insulative housing 2. The pick-up cap 3 is latched by the latching portions 362 to be positioned upon the upper surface of the insulative housing 2. Thereby the pick-up cap 3 is substantially mounted on the electrical connector (not shown). The pick-up cap 3 is reliably mounted on the electrical connector (not shown) by eight latching portions 362 and the whole assembly process is very simple. Thus the insulative housing 2 with the contacts (not shown) will not rock when the electrical connector assembly 1 moves in virtue of the vacuum mechanism (not shown) adsorbing the pick-up cap 3. So, the contacts (not shown) in the insulative housing 2 are always protected by the pick-up cap 3 during the movement process.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector assembly, for removably mounting a chip module to a printed circuit board, comprising:

an electrical connector, comprising:

an insulative housing comprising a main portion having an upper surface and a lower surface and four sidewalls extending upwardly from a peripheral of the main portion; and a plurality of contacts received in the insulative housing, each contact formed with an upper end and a lower end exposed beyond the upper and the lower surfaces of the insulative housing, respectively;

a pick-up cap assembled to the insulative housing and comprising a body portion with four side edges; and a pair of elastic arms spliting from each edge of the body portion and extending toward each other, and each elastic arm having a latching section extending downwardly from a free end thereof, and each sidewall of the insulative housing correspondingly defining a pair of spaced recesses on an out side surface thereof for receiving the latching sections of the air of elastic arms.

2. The electrical connector assembly as claimed in claim 1, wherein the pick-up cap forms a detaching portion at each of the four side edges thereof, and each pair of latching sections are arranged in the same side edge to locate two opposite sides of corresponding detaching portion.

3. The electrical connector assembly as claimed in claim 2, wherein each pair of the elastic arms are located at opposite sides of corresponding detaching portion, respectively, and extend toward each other.

4. The electrical connector assembly as claimed in claim 1, wherein each latching section defines a stretching arm connecting with the elastic arm and a latching portion at a free end of the stretching arm.

5. The electrical connector assembly as claimed in claim 1, wherein the recesses are opening toward a bottom surface of the sidewalls.

6. The electrical connector assembly as claimed in claim 1, wherein two sidewalls of the insulative housing form a pair of spring arms for elastically abutting against the chip module received in the insulative housing.

7. The electrical connector assembly as claimed in claim 6, wherein each spring arm forms a protrusion at a free end thereof for elastically abutting against the chip module.

8. The electrical connector assembly as claimed in claim 6, wherein each of the other two sidewalls form some projections aligned in a row to be regarded as local datum for the chip module.

* * * * *